(12) United States Patent
Doesburg et al.

(10) Patent No.: US 8,603,930 B2
(45) Date of Patent: *Dec. 10, 2013

(54) HIGH-PURITY FUSED AND CRUSHED ZIRCONIA ALLOY POWDER AND METHOD OF PRODUCING SAME

(75) Inventors: Jacobus C. Doesburg, Brooklyn, NY (US); Mitchell R. Dorfman, Smithtown, NY (US); Liangde Xie, Pearl River, NY (US)

(73) Assignee: Sulzer Metco (US), Inc., Westbury, NY (US)

( * ) Notice: Subject to any disclaimer, the term of this patent is extended or adjusted under 35 U.S.C. 154(b) by 1630 days.

This patent is subject to a terminal disclaimer.

(21) Appl. No.: 11/790,430

(22) Filed: Apr. 25, 2007

(65) Prior Publication Data
US 2012/0177836 A1    Jul. 12, 2012

Related U.S. Application Data

(63) Continuation-in-part of application No. 11/520,043, filed on Sep. 13, 2006, now Pat. No. 7,723,249.

(60) Provisional application No. 60/724,268, filed on Oct. 7, 2005.

(51) Int. Cl.
*C04B 35/48* (2006.01)
*B02C 19/00* (2006.01)
*C23C 4/10* (2006.01)

(52) U.S. Cl.
USPC ........... 501/103; 428/701; 428/702; 427/452; 427/453; 264/15

(58) Field of Classification Search
USPC .................. 501/103; 423/608; 428/701, 702; 427/452, 453; 264/15
See application file for complete search history.

(56) References Cited

U.S. PATENT DOCUMENTS

| 4,520,114 A | 5/1985 | David |
| 5,073,433 A | 12/1991 | Taylor |
| 5,993,976 A * | 11/1999 | Sahoo et al. ............... 428/472 |
| 6,042,878 A * | 3/2000 | Bruce ..................... 427/126.2 |
| 6,869,550 B2 * | 3/2005 | Dorfman et al. ............... 264/5 |
| 6,893,994 B2 | 5/2005 | Wallar |

(Continued)

FOREIGN PATENT DOCUMENTS

| EP | 1 772 441 | 11/2011 |
| JP | 3-223455 | 10/1991 |
| WO | WO 02/45931 | 6/2002 |

OTHER PUBLICATIONS

R. Vaβen, N. Czech, W. Malléner, W. Stamm, D. Stöver, "Influence of impurity content and porosity of plasma-sprayed yttria-stabilized zirconia layers on the sintering behaviour", pp. 135-140, Apr. 10, 2000, www.eisevier.nl/locate/surfcoat, Germany.

(Continued)

*Primary Examiner* — Karl Group
(74) *Attorney, Agent, or Firm* — Greenblum & Bernstein, P.L.C.

(57) ABSTRACT

The present invention provides a high-purity fused and crushed stabilized zirconia powder. The powder—with or without further processing, such as plasma spheroidization—is used in thermal spray applications of thermal barrier coatings (TBCs) and high-temperature abradables. The resulting coatings have a significantly improved high temperature sintering resistance, which will enhance the durability and thermal insulation effect of the coating.

12 Claims, 3 Drawing Sheets

(56) References Cited

U.S. PATENT DOCUMENTS

| | | | |
|---|---|---|---|
| 7,931,836 B2 | 4/2011 | Xie et al. | |
| 8,021,762 B2 * | 9/2011 | Taylor et al. | 428/633 |
| 8,394,484 B2 * | 3/2013 | Taylor et al. | 428/134 |
| 2002/0094448 A1 | 7/2002 | Rigney et al. | |
| 2003/0138658 A1 | 7/2003 | Taylor et al. | |
| 2004/0229031 A1 | 11/2004 | Gell et al. | |
| 2005/0170200 A1 | 8/2005 | Nagaraj et al. | |

OTHER PUBLICATIONS

Robert A. Miller, "Thermal Barrier Coatings for Aircraft Engines—History and Directions", NASA Lewis Research Center Mar. 1995, pp. 17-27, Cleveland, OH.

Lou George, "PRAXAIR Introduces New Yttria-Stabilized Zirconia Powder", p. 22, www.ptihome.com, Spraytime First Quarter 2003.

"Amperit Thermal Spray Powder Catalog," H.C. Starck GmbH, published 2005.

Online Catalog "Product Information Amperit 832 Catalog," H.C. Starck GmbH, found at http://www.hcstarck.com/medien/dokumente/document_Produktinfo832.pdf.

"Amperit Thermal Spray Powder Catalog," H.C. Starck, published 1995.

Processing of Yttria Partially Stabilized Zirconia Thermal Barrier Coatings Implementing a High-Power Laser Diode by G. Antou et al., Sep. 2004.

Document entitled Evolution of Porosity and Texture in Thermal Barrier Coatings Grown by EB-PVD by S. G. Terry et al. identified in the Opposition as document D2 (12 pages), 1999.

Document entitled Influence of impurity content and porosity of plasma-sprayed yttria-stabilized zirconia layers on the sintering behavior by R. Vaβen et al. . identified in the Opposition as document D3 (6 pages), 2001.

Document entitled Plasma sprayed thermal barrier coatings for industrial gas turbines: morphology, processing and properties by H. W. Grunling et al. . identified in the Opposition as document D4 (10 pages), 1993.

Document entitled Relation Between the YSZ Powder Properties and Vacuum Plasma Spray Deposited Layers by M. Zadvydas et al. . identified in the Opposition as document D9 (4 pages), 2005.

Document entitled New Amperit 832 by H.C.Starck & Co. KG . identified in the Opposition as document D10 (2 pages).

Document entitled Amperit, Thermal Spray Powders by H.C. Stark 1999 . identified in the Opposition as document D10a (15 pages).

Document entitled Amperit 832 by H.C. Stark identified in the Opposition as document D10b (5 pages).

Document entitled Profilo di sicurezza by H.C. Stark identified in the Opposition as document D10c (4 pages), 2005.

Document entitled Fertigunsauftrag identified in the Opposition as document D11 (1 page).

Document entitled Werksprufzeugnis identified in the Opposition as document D12 (1 page).

Document purporting to be a Purchase Order identified in the Opposition as document D13 (1 page).

Document showing a Chart identified in the Opposition as document D14 (1 page).

Document entitled Porosity identified in the Opposition as document D15 (6 page).

Document entitled Rompp Chemie Lexikon by Prof. Dr. J. Falbe et al. identified in the Opposition as document D15a (5 pages).

Document entitled Die physikalischen and chemischen Grundlagen der Keramik identified in the Opposition as document D15b (2 pages), 1968.

Document entitled Thermal Conductivity of dense and posous yttria-stabilized zirconia by K. W. Schlichting et al. identified in the Opposition as document D15c (8 pages), 2001.

Document entitled Microstructure and Thermal Conductivity of Layered Thermal Barrier Coatings Processed by Plasma Spray and Physical Vapor Deposition Techniques by K. S. Ravichandran et al. identified in the Opposition as document D15d (12 pages).

Document entitled Sintering Studies of Plasma-Sprayed Zirconia by H. E. Eaton et al. identified in the Opposition as document D16 (10 pages), 1987.

Document showing a Chart identified in the Opposition as document D17 (1 page).

Document entitled Zusatzstoffnorm / Auxilliary specification identified in the Opposition as document D18a (6 pages).

Document entitled Zusatzstoffnorm / Filler materials specification identified in the Opposition as document D18b (5 pages).

* cited by examiner

HIGH-PURITY FUSED AND CRUSHED ZIRCONIA ALLOY POWDER AND METHOD OF PRODUCING SAME

CROSS REFERENCE TO RELATED APPLICATIONS

This application is a continuation-in-part of U.S. patent application Ser. No. 11/520,043, filed Sep. 13, 2006, now U.S. Pat. No. 7,723,249 which application claims priority under 35 U.S.C. §119(e) from U.S. Provisional Patent Application No. 60/724,268, filed on Oct. 7, 2005, both of which are incorporated herein by reference.

STATEMENT REGARDING SPONSORED RESEARCH OR DEVELOPMENT

Not Applicable.

REFERENCE TO SEQUENCE LISTING

Not Applicable.

BACKGROUND OF THE INVENTION

1. Field of the Invention

This invention relates generally to powders for use in thermal barrier coatings and high-temperature abradable coatings, and more particularly to high-purity fused and crushed zirconia alloy powder for use with thermal spray deposition processes.

2. Description of Related Art

Superior high-temperature properties are required to improve the performance of heat resistant and corrosion resistant members. These members include, for example, gas turbine blades, combustor cans, ducting and nozzle guide vanes in combustion turbines and combined cycle power plants. Turbine blades, for example, are driven by hot gasses, and the efficiency of the gas turbine increases with the rise in operation temperature. The demand for continued improvement in efficiency has driven the system designers to specify increasingly higher turbine inlet temperatures. Thus, there is a continuing need for materials that can achieve higher operational temperatures.

Ceramic coatings generally have been used to allow standard materials to operate in higher temperature environments. Ceramic thermal barrier coatings and high temperature abradable coatings may be applied using, for example, a thermal spray process. In one form of this process, ceramic powder feedstock is injected into a high velocity plasma stream where it is simultaneously melted and propelled toward a substrate.

One factor that impacts coating lifetime is the sintering rate of the coating. When the coating is cycled above half of its absolute melting temperature, the coating begins to sinter causing volume shrinkage. As the coating shrinks, the stress difference between the coating and substrate increases. At a certain amount of shrinkage (which varies depending on the type of structure), the stress difference exceeds the adhesive or cohesive strength of the coating and it becomes detached. Decreasing the sintering rate increases the amount of time before the critical shrinkage is achieved, so it can become a major design consideration.

As industry demands continue to drive higher operating temperatures, there remains a need in the art for coating materials that can meet performance requirements at increasingly higher temperatures.

SUMMARY OF THE INVENTION

Accordingly, the invention is directed to a material for obtaining coatings for high temperature cyclic applications that have both improved sintering resistance to achieve a high service lifetime and low thermal conductivity to achieve high operating temperatures. The present invention meets the aforementioned needs by providing a high-purity fused and crushed stabilized zirconia ($ZrO_2$) and/or hafnia ($HfO_2$) powder that has about 60-95 weight percent zirconia ($ZrO_2$) and/or hafnia ($HfO_2$), and about 5-40 weight percent of a stabilizer (which may be yttria, ceria, ytterbia, or other rare earth oxides individually or in any combination). Any other oxide or chemical species in the inventive composition must be less than about 0.1 weight percent.

Relative to currently-available fused and crushed stabilized zirconia powder, the high-purity fused and crushed stabilized zirconia powder of the present invention has a lower content of impurities such as soda, silica, alumina and titania. Thermal barrier coatings and high temperature abradable coatings made from the high-purity fused and crushed stabilized zirconia powder of the present invention exhibit significantly improved sintering resistance, which will lead to prolonged coating durability and enhanced thermal insulation effect.

In one aspect, the invention provides a fused and crushed stabilized powder for thermal spray applications that includes between about 60 and 95 weight percent zirconia ($ZrO_2$) and/or hafnia ($HfO_2$), between about 5 and 40 weight percent of a stabilizer, and between about 0 and 0.1 weight percent other oxides or chemical species. The stabilizer may be one or more of yttria ($Y_2O_3$), ceria ($CeO_2$), dysprosia ($Dy_2O_3$), ytterbia ($Yb_2O_3$), or other rare earth oxides.

According to another aspect of the invention, a fused and crushed stabilized powder for thermal spray applications is provided that includes between about 60 and 95 weight percent zirconia ($ZrO_2$) and/or hafnia ($HfO_2$), typically between about 0 and 2.5 weight percent hafnia ($HfO_2$), between about 5 and 40 weight percent of a stabilizer, and between about 0 and 0.1 weight percent other oxides or chemical species.

In another aspect of the invention, a method of producing a stabilized powder for thermal spray applications is provided that includes the step of providing raw materials of about 60 to 95 weight percent zirconia ($ZrO_2$) and/or hafnia ($HfO_2$), about 5 to 40 weight percent stabilizer, and about 0 to 0.1 weight percent other oxides or chemical species. A further step of the method includes fusing the raw materials, followed by crushing the fused materials to achieve a particle size suitable for thermal spray applications. Additionally, the method may include the optional step of subjecting the crushed powder to a plasma spheroidization process. Typical particle sizes may be in the range of between about 5 to 200 microns, depending on, among other factors, the desired microstructure of coating.

In one other aspect of the invention, a method of providing a thermal sprayed coating on a substrate is provided. The method includes the step of providing a powder with a particle composition of between about 60 and 95 weight percent zirconia ($ZrO_2$) and/or hafnia ($HfO_2$), between about 5 and 40 weight percent stabilizer, and between about 0 and 1.0 weight percent other oxides or chemical species. A next step includes applying the powder to the substrate using a thermal spraying technique. Suitable thermal spray techniques include plasma, detonation, high velocity oxy-fuel (HVOF) process, or powder combustion.

Additional objects and advantages of the invention will be set forth in the description which follows, and in part will be

DETAILED DESCRIPTION OF THE INVENTION

The present invention provides a high-purity fused and crushed zirconia alloy powder that has between about 60 to 95 weight percent zirconia ($ZrO_2$) and/or hafnia ($HfO_2$) and about 5 to 40 weight percent of a stabilizer. The stabilizer may be one of several stabilizers including yttria ($Y_2O_3$), ceria ($CeO_2$), dysprosia ($Dy_2O_3$), ytterbia ($Yb_2O_3$), or other rare earth oxides individually or in any combination. To achieve the high sintering resistance and extended service lifetime, the inventive composition must have a high purity such that any other oxide or chemical species in the inventive composition must be less than 0.1 weight percent. In one embodiment, soda content will be less than 0.05%, silica content will be less than 0.05%, alumina content will be less than 0.01% and titania content will be less than 0.05%.

Figure 1:
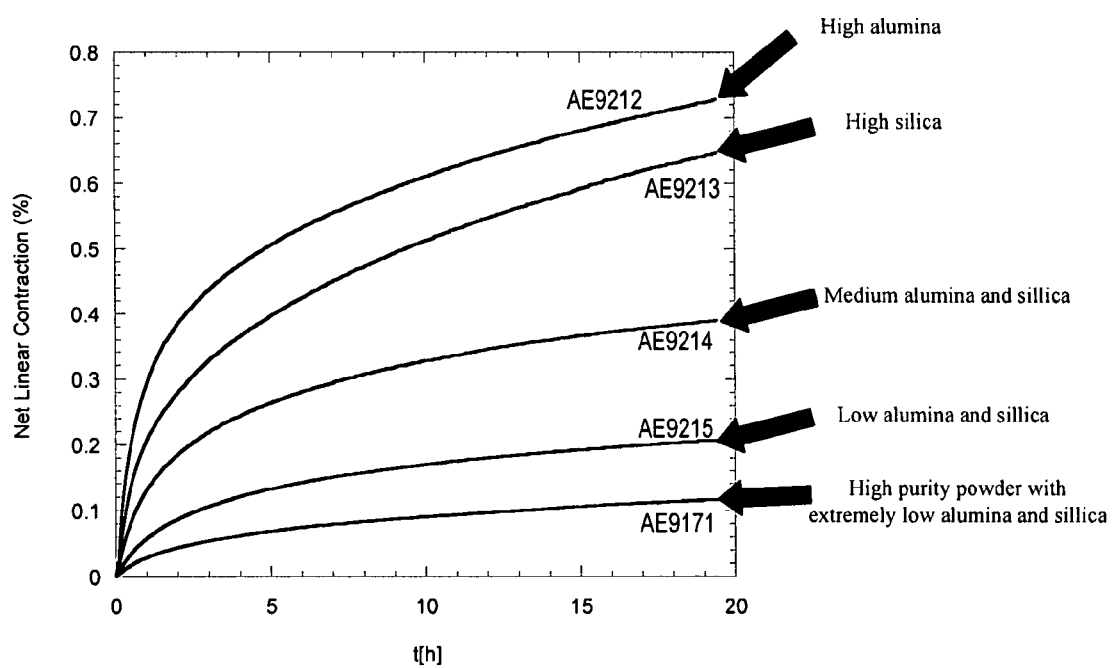
FIG. 1 provides a chart showing the improved sintering resistance of coatings made from one embodiment of powder according to the present invention.

When subject to high temperature heat treatment, coatings of zirconia alloys will shrink in size due to sintering. For coatings made from high purity zirconia alloys, the shrinkage due to sintering can be as much as 80% less than what is observed in coatings made from low purity zirconia alloys. As an example, FIG. 1 shows that the coating made from high purity 8 weight percent $Y_2O_3$—$ZrO_2$ powder has a greatly improved sintering resistance. The chart shows linear in-plane shrinkage of several coatings sintered at 1400° C. It shows that the coating made from the high purity powder has significantly less shrinkage due to its greatly improved sintering resistance.

Figure 2:
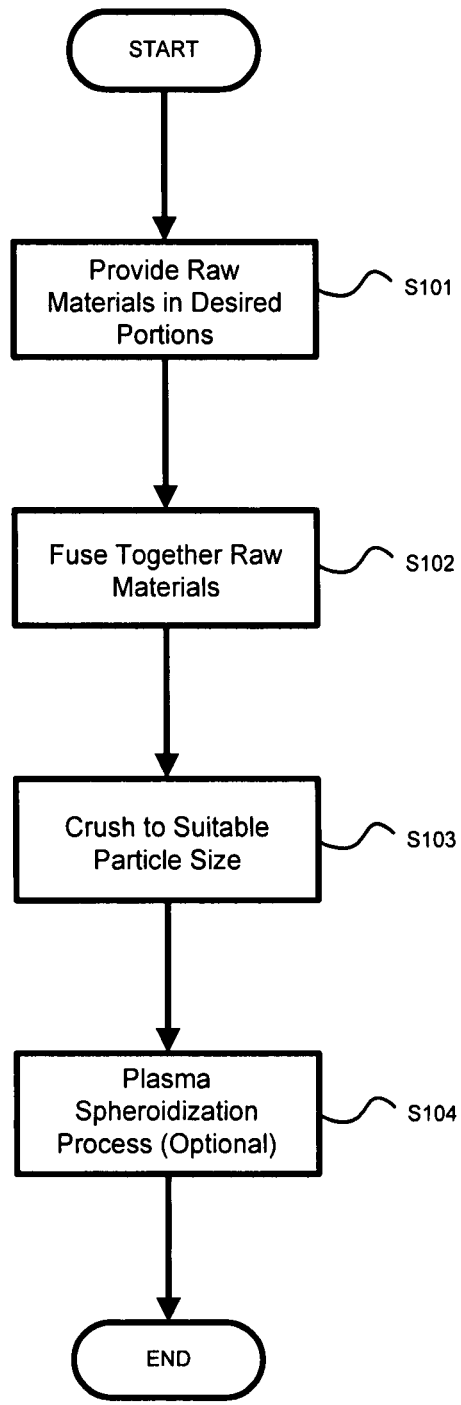
FIG. 2 provides a flow chart of a method for producing high-purity stabilized zirconia powder in accordance with the present invention.
Figure 3:
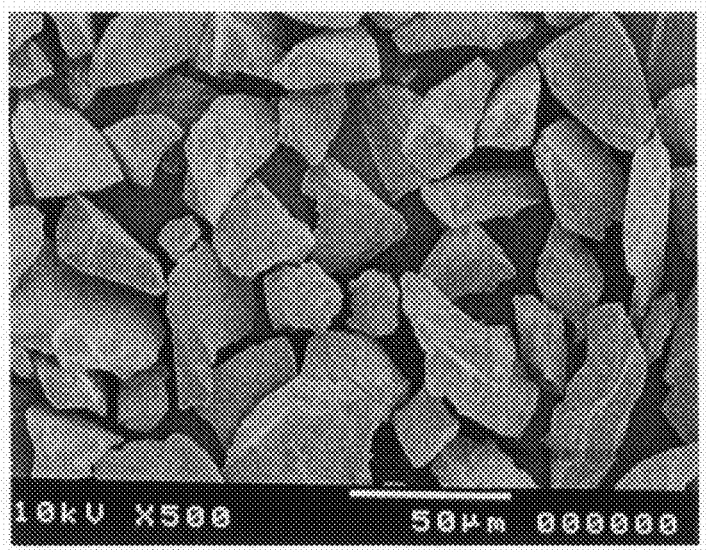
FIG. 3 provides a micrograph of a fused and crushed powder in accordance with one embodiment of the present invention.

FIG. 2 provides a flow chart of a method for making powder of the above compositions. In step S101, raw materials of the appropriate composition are provided. The raw material composition is provided in the same weight percentages as desired in the final powder composition. Thus, raw materials will include between about 60 to 95 weight percent zirconia ($ZrO_2$) and/or hafnia ($HfO_2$) (typically including up to 2.5 weight percent hafnia), and between about 5 to 40 weight percent stabilizer(s) (such as one or more of yttria, ceria, dysprosia, ytterbia, and other rare earth oxides). In step S102, the raw materials are fused together into a solid mass. Impurities, such as silica, alumina, titania and other oxides or chemical species, in the fused powder must be no more than 0.1 weight percent. The fusing process is followed, in step S103, by crushing to achieve a suitable particle size. Suitable particle size will vary depending on the desired coating microstructure, the type of thermal spray technique being used, and other factors. Particle size may range between about 5 to 200 microns, with more typical ranges between about 15 to 125 microns. A micrograph of powder made in accordance with the above process is shown in FIG. 3.

Subsequent to fusing and crushing, the high-purity powder may optionally be further processed by a plasma spheroidization process. This optional step is shown as step S104 in FIG. 2. Plasma spheroidization processes are generally known to improve, among other properties, powder flow characteristics. As applied to the present invention, the process basically involves in-flight heating and melting of the crushed high-purity powder particles. Molten spherical droplets are formed, which are then cooled under free fall conditions. The flight time of the droplets is controlled so that they solidify before reaching the bottom of a primary collection chamber. The resulting powder particles have improved flow characteristics than the fused and crushed powder.

The high-purity stabilized powder can be applied onto an object or substrate to provide a thermal barrier or abradable coating. Applying the powder to the substrate can be accomplished using one or more thermal spraying techniques such as plasma spray, detonation, HVOF, or powder combustion.

The material of the present invention contains zirconia ($ZrO_2$) and/or hafnia ($HfO_2$) partially stabilized by a total of 4 to 20 weight percent of a primary stabilizing oxide such as ytterbia and/or yttria, (and optionally additional stabilizers of one or more rare earth oxides) having total impurities less than or equal to 0.15 weight percent, and preferably less than or equal to 0.1 weight percent. For purposes of the present invention, oxide impurities can be defined as materials which when combined with each other or with zirconia form phases with melting points much lower than that of pure zirconia, especially—but not limited to—soda ($Na_2O$), silica ($SiO_2$), and alumina ($Al_2O_3$). Other specific concentration ranges of stabilizers are provided herein and in co-pending and commonly assigned U.S. patent application Ser. No. 11/520,041, entitled "HIGH PURITY CERAMIC ABRADABLE COATINGS," U.S. patent application Ser. No. 11/520,044, entitled "OPTIMIZED HIGH TEMPERATURE THERMAL BARRIER," and U.S. application Ser. No. 11/520,042, entitled "OPTIMIZED HIGH PURITY COATING FOR HIGH TEMPERATURE THERMAL CYCLING APPLICATIONS" each filed on Sep. 13, 2006 and each incorporated herein by reference.

In accordance with embodiments of the invention, the limits for known impurities in order to achieve a desirable sintering rate and therefore increase service lifetime when used as a coating are about:

soda ($Na_2O$) 0.1 weight percent
silica ($SiO_2$) 0.05 weight percent
alumina ($Al_2O_3$) 0.01 weight percent
titania ($TiO_2$) 0.05 weight percent
hematite ($Fe_2O_3$) 0.05 weight percent
calcia (CaO) 0.05 weight percent, and
magnesia (MgO) 0.05 weight percent.

In a preferred embodiment, the limits for known impurities are about:

$Na_2O$ 0.01 weight percent
$SiO_2$ 0.01 weight percent
$Al_2O_3$ 0.01 weight percent
$TiO_2$ 0.01 weight percent
$Fe_2O_3$ 0.01 weight percent
CaO 0.025 weight percent, and
MgO 0.025 weight percent.

The impurity limits in the embodiments above are not indicative that any or all of the impurities listed will be included in the material in any amount. The embodiment of the invention may include zero weight percent of one or more of the above-listed impurities.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

The invention claimed is:

1. A fused and crushed stabilized powder for thermal spray applications, comprising:
   between about 60 and 95 weight percent zirconia ($ZrO_2$), with hafnia ($HfO_2$) in an amount of up to about 2.5 weight percent;
   between about 5 and 40 weight percent stabilizer; and
   between about 0 and 0.1 weight percent of a total amount of impurities,
   wherein the total amount of impurities is less than or equal to:
      about 0.01 weight percent soda,
      about 0.01 weight percent silica,
      about 0.01 weight percent alumina,
      about 0.01 weight percent titania,
      about 0.01 weight percent hematite,
      about 0.025 weight percent calcia, and
      about 0.025 weight percent magnesia.

2. The stabilized powder of claim 1, wherein said stabilizer is one or more of yttria ($Y_2O_3$), ceria ($CeO_2$), dysprosia ($Dy_2O_3$), ytterbia ($Yb_2O_3$), or other rare earth oxides.

3. A method of producing a stabilized powder for thermal spray applications, comprising:
   providing raw materials of about 60 and 95 weight percent zirconia, with hafnia ($HfO_2$) in an amount of up to about 2.5 weight percent; about 5 and 40 weight percent stabilizer; and about 0 to 0.1 weight percent of a total amount of impurities;
   fusing the raw materials followed by crushing the fused materials to achieve particle size suitable for thermal spray applications,
   wherein the total amount of impurities is less than or equal to:
      about 0.01 weight percent soda,
      about 0.01 weight percent silica,
      about 0.01 weight percent alumina,
      about 0.01 weight percent titania,
      about 0.01 weight percent hematite,
      about 0.025 weight percent calcia, and
      about 0.025 weight percent magnesia.

4. The method of claim 3, further comprising subjecting the crushed materials to a plasma spheroidization process.

5. A method of providing a thermal coating on a substrate comprising:
   providing a powder with a particle composition of between about 60 and 95 weight percent zirconia, with hafnia ($HfO_2$) in an amount of up to about and 2.5 weight percent; between about 5 and 40 weight percent stabilizer; and between about 0 and 0.1 weight percent of a total amount of impurities;
   forming spherical powder particles of said powder under free fall conditions; and
   applying the powder to the substrate using a thermal spraying technique,
   wherein the total amount of impurities is less than or equal to:
      about 0.01 weight percent soda,
      about 0.01 weight percent silica,
      about 0.01 weight percent alumina,
      about 0.01 weight percent titania,
      about 0.01 weight percent hematite,
      about 0.025 weight percent calcia, and
      about 0.025 weight percent magnesia.

6. A powder for thermal spray applications, comprising:
   between about 60 and 95 weight percent zirconia ($ZrO_2$) and/or hafnia ($HfO_2$);
   between about 5 and 40 weight percent stabilizer; and
   between about 0 and 0.1 weight percent of a total amount of impurities,
   wherein powder particles of said powder comprise spherical particles formed under free fall conditions, and
   wherein the total amount of impurities is less than or equal to:
      about 0.01 weight percent soda,
      about 0.01 weight percent silica,
      about 0.01 weight percent alumina,
      about 0.01 weight percent titania,
      about 0.01 weight percent hematite,
      about 0.025 weight percent calcia, and
      about 0.025 weight percent magnesia.

7. The powder of claim 6, wherein said about 60 and 95 weight percent zirconia ($ZrO_2$) and/or hafnia ($HfO_2$) comprises about 60 and 95 weight percent zirconia ($ZrO_2$)

8. The powder of claim 6, wherein said about 60 and 95 weight percent zirconia ($ZrO_2$) and/or hafnia ($HfO_2$) comprises about 60 and 95 weight percent hafnia ($HfO_2$).

9. The powder of claim 6, wherein said stabilizer is one or more of yttria ($Y_2O_3$), ceria ($CeO_2$), dysprosia ($Dy_2O_3$), ytterbia ($Yb_2O_3$), or other rare earth oxides.

10. The powder of claim 6, wherein the powder particles comprise a particle size ranging between about 5 and 200 microns.

11. The powder of claim 1, wherein powder particles of said powder comprise spherical particles formed under free fall conditions.

12. The method of claim 3, further comprising forming spherical powder particles of said stabilized powder under free fall conditions.

* * * * *